(12) United States Patent
Mitani et al.

(10) Patent No.: US 8,093,799 B2
(45) Date of Patent: Jan. 10, 2012

(54) CERAMIC COMPOSITE FOR PHOTOTRANSFORMATION AND LIGHT EMITTING DEVICE USING THE SAME

(75) Inventors: Atsuyuki Mitani, Yamaguchi (JP); Shin-ichi Sakata, Yamaguchi (JP)

(73) Assignee: Ube Industries, Ltd. (JP)

( * ) Notice: Subject to any disclaimer, the term of this patent is extended or adjusted under 35 U.S.C. 154(b) by 378 days.

(21) Appl. No.: 12/440,036

(22) PCT Filed: Sep. 18, 2007

(86) PCT No.: PCT/JP2007/068593
§ 371 (c)(1),
(2), (4) Date: Mar. 5, 2009

(87) PCT Pub. No.: WO2008/041566
PCT Pub. Date: Apr. 10, 2008

(65) Prior Publication Data
US 2010/0181897 A1  Jul. 22, 2010

(30) Foreign Application Priority Data

Sep. 25, 2006 (JP) ................. 2006-258187

(51) Int. Cl.
*H01J 1/62* (2006.01)
(52) U.S. Cl. .................. 313/503; 252/301.4 R
(58) Field of Classification Search .......... 313/498–512; 252/301.4 R
See application file for complete search history.

(56) References Cited

U.S. PATENT DOCUMENTS

| 5,004,948 A | 4/1991 | Kinczel et al. |
|---|---|---|
| 5,484,752 A | 1/1996 | Waku et al. |
| 5,569,547 A | 10/1996 | Waku et al. |
| 5,902,763 A | 5/1999 | Waku et al. |
| 5,981,415 A * | 11/1999 | Waku et al. ................ 501/80 |
| 2006/0124951 A1 * | 6/2006 | Sakata et al. ................ 257/99 |

FOREIGN PATENT DOCUMENTS

| EP | 1 588 991 A1 | 10/2005 |
|---|---|---|
| EP | 1 760 794 A1 | 3/2007 |
| JP | 7-149597 A | 6/1995 |
| JP | 7-187893 A | 7/1995 |
| JP | 8-81257 A | 3/1996 |
| JP | 8-253389 A | 10/1996 |
| JP | 8-253390 A | 10/1996 |
| JP | 9-67194 A | 3/1997 |
| JP | 10-17396 A | 1/1998 |
| JP | 2000-208815 A | 7/2000 |
| WO | 2004/065324 A1 | 8/2004 |

* cited by examiner

*Primary Examiner* — Anne M Hines
(74) *Attorney, Agent, or Firm* — DLA Piper LLP (US)

(57) ABSTRACT

A light-converting ceramic composite comprising a solidified body having a texture of at least two or more oxide phases being continuously and three-dimensionally entangled together, with at least one of the oxide phases being a fluorescence-emitting crystal phase, wherein the interface length between the oxide phases per 1 $mm^2$ of a plane in the light-converting ceramic composite is from 150 to 1,500 mm.

12 Claims, 3 Drawing Sheets

CERAMIC COMPOSITE FOR PHOTOTRANSFORMATION AND LIGHT EMITTING DEVICE USING THE SAME

CROSS-REFERENCE TO RELATED APPLICATIONS

This application claims the benefit of priority based upon Japanese Patent Application No. 2006-258187, filed at the Japan Patent Office on Sep. 25, 2006, the contents of which are incorporated herewith by reference.

TECHNICAL FIELD

Thee present invention relates to a light conversion member used, for example, in a light-emitting diode applicable to-displays, lighting, backlight sources and the like, and a light-emitting device using the member. More specifically, the present invention relates to a light-converting ceramic composite which is a light conversion member for obtaining, fluorescence by utilizing irradiation light, and a light-emitting device Using the light-converting ceramic composite.

BACKGROUND ART

In recent years, studies are being aggressively made to develop a White light-emitting device using a blue light-emitting element as a light-emitting source. In particular, a white light-emitting diode using a blue light-emitting diode is lightweight and mercury-free and has long life, and therefore demands therefor are expected to rapidly expand in the future. A most commonly employed method for converting blue light of a blue light-emitting element into white light is a method of obtaining a pseudo-white color by mixing a blue color and a yellow color which are in a complementary relationship. For example, as described in Japanese Unexamined Patent Publication (Kokai) No 2000-208815, a coating, layer containing a fluorescent material capable of absorbing a part of blue light and emitting yellow light is provided on the front surface of a light-emitting diode that emits blue light, and a mold layer or the like for mixing blue light of the light source and yellow light, from the florescent material is provided ahead of the coating layer, whereby a white light-emitting diode can be fabricated. As for the fluorescent material, a cerium-activated YAG ($Y_3Al_5O_{12}$) powder or the like is used.

However, in the structure of a white light-emitting diode used at present as typified by the structure described in Japanese Unexamined Patent Publication (Kokai) No. 2000-208815, the fluorescent material powder is mixed with a resin such as epoxy and then coated, and therefore, for example, control for ensuring uniformity of the mixed state of the fluorescent material powder with the resin or stabilizing the thickness of the coated film is difficult and the white light-emitting diode readily undergoes color unevenness or fluctuation. The resin required when using a fluorescent material powder is poor in leaf resistance compared with a metal or ceramic and may cause reduction in the transmittance due to alteration by heat from the light-emitting element, hindering realization of a high-output white light-emitting diode that is currently demanded.

The present inventors have proposed a white light-emitting device fabricated using a blue light-emitting element and a light-converting ceramic composite comprising a solidified body in which a plurality of oxide phases including a fluorescence-emitting crystal phase are formed to be continuously and three-dimensionally entangled with each other (International Publication No. WO2004/065324, pamphlet). This light-converting ceramic composite enables stably obtaining homogeneous yellow fluorescence by virtue of uniform distribution of fluorescent phases and is excellent in heat resistance because of the ceramic. The ceramic composite itself is a bulk body and requires no resin for the fabrication of a white light-emitting device, so that the fabricated white light-emitting device can be reduced in the color unevenness or fluctuation and is very suitable for realizing high-output light emission.

DISCLOSURE OF THE INVENTION

However, in the light-converting ceramic composite above, the ratio of respective phases is limited to a certain extent, because an eutectic reaction between oxide phases which are a constituent phase is utilized in the production process, and it is difficult to greatly change the amount of a fluorescence-emitting crystal phase. Accordingly, in the case where a yellow light component needs to be increased for the color adjustment of the light-emitting device, the thickness required of light-converting ceramic composite becomes large and the material cost of the light-converting ceramic composite disadvantageously rises. Light loss inside of the light-converting ceramic composite is small but when the thickness is increased, the loss increases and this is not preferred in view of enhancing emission efficiency of the light-emitting device.

An object of the present invention is to provide a light-converting ceramic composite ensuring that higher-intensity fluorescence can be obtained with the same thickness and fluorescence equal to or greater than the conventional fluorescence can be obtained with a smaller thickness. Another object of the present invention is to provide a light-emitting device using a light-emitting element and the light-converting ceramic composite above and being highly efficient, small in the fluctuation of color and very suitable for high-output light emission.

The present invention relates to a light-converting ceramic composite which is a bulk comprising a solidified body having a texture of at least two or more oxide phases being continuously and three-dimensionally entangled together, with at least one of the oxide phases being a fluorescence-emitting crystal phase, wherein the interface between the oxide phases is present to extend for a length of 150 to 1,500 mm per 1 $mm^2$ of a plane in the light-converting ceramic composite.

One embodiment of the light-converting ceramic composite above is the light-converting ceramic composite which contains at least the Y element, the Al element and the Ce element as the composition components.

The present invention also relates to a light-emitting device comprising the light-converting ceramic composite above and a light-emitting element.

One embodiment of the light-emitting device above is the light-emitting device where the light-converting ceramic composite emits fluorescence having a peak at a wavelength of 530 to 580 nm and the light-emitting element emits light having a peak at a wavelength of 400 to 500 nm.

In the light-converting ceramic composite of the present invention, higher intensity fluorescence than ever before can be obtained from the same incident light with the same thickness, so that a necessary fluorescence intensity can be obtained with a smaller thickness. Therefore, an excellent, light-converting ceramic composite reduced in the light loss inside of the ceramic composite can be provided. By combining a light-emitting element and this light-converting ceramic composite, a larger quantity of light can be radiated from the same light-emitting element. Furthermore, since the ceramic composite can be made thinner than before, the amount of the ceramic composite used can be reduced. For this reason, a high-efficiency white light-emitting device very suitable for high-output light emission can be provided at a low cost.

BEST MODE FOR CARRYING OUT THE INVENTION

The present invention is described in detail below.

The light-converting ceramic composite of the present invention is a solidified body having a texture of at least two or more oxide phases being continuously and three-dimensionally entangled together, with at least one of these oxide phases being a fluorescence-emitting phase. Therefore, fluorescence can be emitted by making excitation light to be incident on the light-converting ceramic composite. The texture is a microtexture where the interface of the oxide phases in contact with each other is present and extend for a length of 150 to 1,500 mm per 1 mm$^2$ of a certain plane of the light-converting ceramic composite. Incidentally, when the texture of the light-converting ceramic composite is planarly observed, the interface is observed as a boundary line, and the length of this boundary line is hereinafter referred to as an "interface length".

Figure 2:
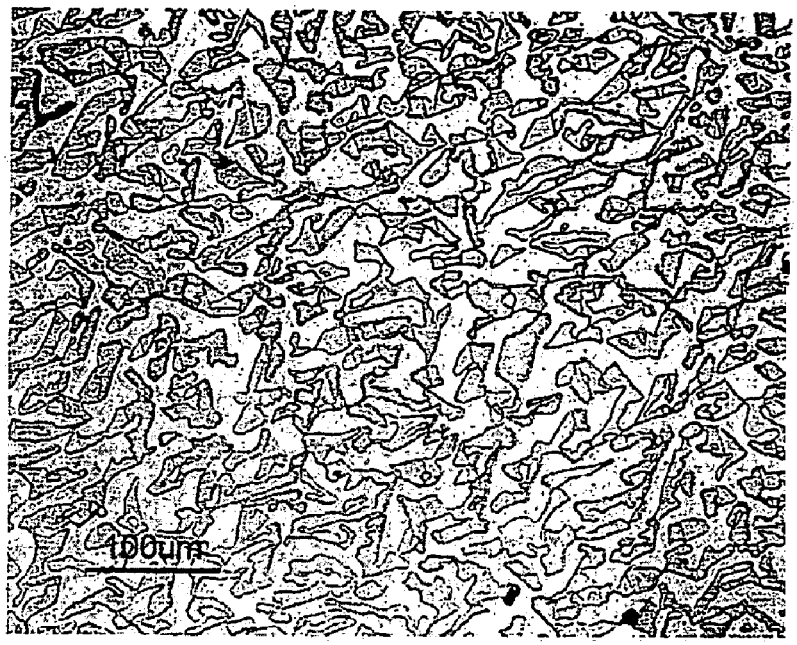
FIG. 2 is a photomicrograph illustrating one example of the texture structure of the light-converting ceramic composite of the present invention.

The light-converting ceramic composite has, for example, as shown in FIG. 2, a texture of oxide phases being continuously entangled together, and the particle diameter used in normal ceramics as an index for assessing the texture size cannot be defined. Therefore, the length of the interface of oxide phases being in contact with each other per 1 mm$^2$ on a certain plane in the light-converting ceramic composite (interface length) is defined as an index for assessing the texture size. That is, a longer interface length is indicative of a smaller texture size. When the interface length is long and the texture size is small, probability of a fluorescence-emitting crystal phase being present on the light path for incident light becomes high, so that the excitation light can be efficiently absorbed and higher-intensity fluorescence can be obtained. The interface length as used herein means an average interface length in the light-converting ceramic composite. When the interface length is 150 mm or more, fluorescence higher in the intensity by 10% or more than the light-converting ceramic-composite having an interface length of 50 mm with the same thickness can be obtained. The interface length is preferably 200 mm or more, because fluorescence with still higher intensity can be obtained. Since the texture size has a distribution, even when a region having a large texture size (a region where the interface length is short) is locally present, a microstructure on the macroscopic average exists and therefore, the effects of the present invention can be obtained. The interface length is preferably 1,500 mm or less, because in general, the interface length may be prolonged by, for example, increasing the cooling rate at the solidification out of the production conditions, but if the cooling rate is too high, a good solidified body becomes difficult to obtain.

The oxide phase varies according to the composition components and production conditions of the solidified body and is not particularly limited, but in the case of containing at least the Y element, the Al element and the Ce element as the composition components, examples of the oxide phase include an Al$_2$O$_3$(sapphire) phase and a (Y,Ce)$_3$Al$_5$O$_{12}$, phase. At least two or more phases of these oxide phases are contained. The solidified body has a structure where out of oxide phases contained, at least two phases are continuously, and three-dimensionally entangled with each other. A part of the oxide phase is sometimes present like particles in the mutually entangled structure formed by other oxide phases. In any case, at the boundary of respective phases, a boundary layer such as amorphous phase is not present and the oxide phases are directly contacted with each other. Therefore, light is less lost in the light-converting ceramic composite and the light transmittance is high.

The fluorescence-emitting crystal phase also varies depending on the composition components and the production conditions of the solidified body and is not particularly limited, but in the case of containing at least the Y element, the Al element and the Ce element as the composition components, examples of the fluorescence-emitting crystal phase include, out of the above-described oxide phases, a (Y,Ce)$_3$Al$_5$O$_{12}$ phase, and at least one of these fluorescence-emitting phases is contained. The solidified body takes a structure where oxide phases including such a fluorescence-emitting phase are continuously and three-dimensionally entangled with each other, and entire oxide phases are uniformly distributed in the light-converting ceramic composite, so that homogeneous fluorescence without partial disproportionation can be obtained.

From the combination of the Al$_2$O$_3$ phase and the (Y,Ce)$_3$Al$_5$O$_{12}$ phase, a structure where both phases are continuously and three-dimensionally entangled with each other can be easily obtained. The (Y,Ce)$_3$Al$_5$O$_{12}$ phase emits fluorescence with a peak wavelength of 530 to 560 nm by the use of a violet-to-blue excitation light at 400 to 500 nm and is suitable as a light-converting member for a white light-emitting device. Therefore, it is preferred to contain at least the Y element, the Al element and the Ce element as the composition components. When the oxide phase additionally contains a Gd element, a (Y,Gd,Ce)$_3$Al$_5$O$_{12}$ phase is produced as the fluorescent material phase, and fluorescence with a peak wavelength of 540 to 580 nm on the longer wavelength side can be emitted.

In the light-converting ceramic composite of the present invention, unlike the structure disclosed in Kokai (Japanese Unexamined Patent Publication) No. 2000-208815 obtained by mixing a fluorescent material powder in a resin, the light-converting ceramic composite itself is a bulk body and allows uniform distribution of fluorescent material phases, so that homogeneous yellow fluorescence can be stably obtained and the fabrication of a white light-emitting device can dispense with a resin. Accordingly, the white light-emitting device of the present invention is reduced in the color unevenness or fluctuation and it very suitable for high-output light emission. Also, the heat resistance is excellent because of a ceramic.

The solidified body constituting the light-converting ceramic composite of the present invention, is produced by melting the raw material oxide and solidifying the melt. For example, the solidified body can be obtained by a simple and easy method of charging the melt into a crucible kept at a predetermined temperature and then cooling and congealing it while controlling the cooling temperature, but the solidified body is most preferably produced by a unidirectional solidification method, because when unidirectional solidification is performed, the crystal phase contained continuously grows in a single crystal state and attenuation of light in the member is reduced.

The solidified body constituting the light-converting ceramic composite of the present invention may be the same as the ceramic composite material disclosed, for example, in Kokai Nos. 7-149597, 7-187893, 8-81251, 8-253389, 8-253390 and 9-67194 previously filed by the applicant of the present invention and their corresponding U.S. applications (U.S. Pat. Nos. 5,569,547, 5,484,752 and 5,902,963), except that at least one oxide phase is a fluorescence-emitting phase and the texture is a microtexture, and can be produced by the production method disclosed in these patent applications (or patents). The contents disclosed in these patent applications and patents are incorporated herein by reference.

The light-converting ceramic, composite of the present invention is obtained by adjusting the production conditions to give a predetermined interface length at the production of the solidified body according to the above-described method and processing the resulting solidified body into a predetermined shape. The production conditions adjusted are not particularly limited, but in general, the solidified body obtained comes to have a long interface length and a small texture size by increasing the cooling rate at the solidification, and this technique is suitably used. In the unidirectional solidification, the cooling rate can be increased by increasing the moving-down speed.

In this way, the light-converting ceramic composite of the present invention enables obtaining homogeneous fluorescence, because oxide phases including a fluorescence-emitting crystal phase are present in a state of being continuously and three-dimensionally entangled together. At the same time, the interface of oxide phases being in contact with each other has a long length and the texture size is small, so that light can be efficiently absorbed into the fluorescence-emitting crystal phase and fluorescence with higher intensity can be obtained. By virtue of these effects, a required fluorescence intensity can be obtained with a smaller thickness than ever before, and therefore, a light-converting ceramic composite less allowing light loss inside of the ceramic composite can be provided.

Figure 1:
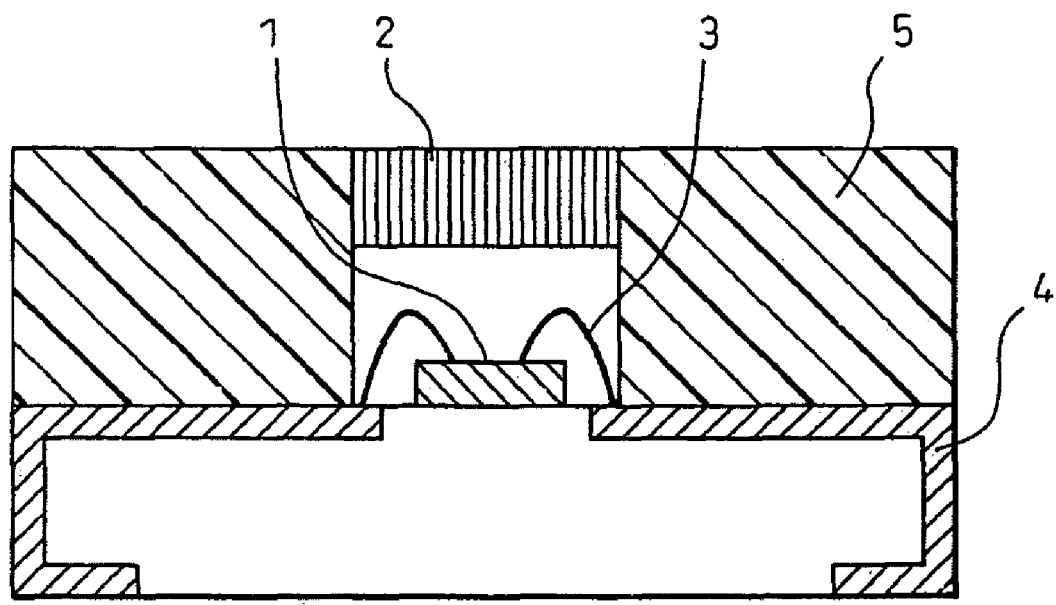
FIG. 1 is a schematic cross-sectional view illustrating one embodiment of the light-emitting device of the present invention.

The light-emitting device of the present invention is a device comprising the light-converting ceramic composite of the present invention and a light-emitting element, where light from the light-emitting element is irradiated on the light-converting ceramic composite and light transmitted through the light-converting ceramic composite and fluorescence obtained after wavelength conversion of the light from the light-emitting element by the light-converting ceramic composite are utilized. FIG. 1 is a schematic cross-sectional view illustrating one embodiment of the light-emitting device of the present invention. In the FIG. 1, numeral 1 is a light-emitting element (light-emitting diode element), 2 is a light-converging ceramic composite, 3 is a lead wire, 4 is a lead electrode, and 5 is a holder for the light-converting ceramic composite 2. Light emitted from the light-emitting element is incident on the light-converting ceramic composite 2, and a part of the incident light is absorbed by a fluorescent material and converted into light at a longer wavelength. This light after conversion outgoes from the fluorescent material and at the same time, is mixed with light that is not absorbed in the light-converting ceramic composite 2 but passes therethrough, and then allowed to outgo from the light-converting ceramic composite 2.

The white light-emitting device as one;embodiment of the light-emitting device of the present invention comprises a violet-to-blue light-emitting element that emits light having a peak at a wavelength of 400 to 500 nm and the above-described light-converting ceramic composite that emits yellow fluorescence with a peak wavelength of 530 to 580 nm. The violet-to-blue light emitted from the violet-to-blue light-emitting element enters into the light-converting ceramic composite of which fluorescence peak wavelength is adjusted according to the wavelength of the emitted light such that a white color can be obtained. The yellow fluorescence from the excited fluorescence-emitting phase and the violet-to-blue light transmitted through a crystal phase that does not emit fluorescence are homogeneously mixed by the structure where oxide phases are continuously and three-dimensionally entangled with each other, as a result, a white color with less color unevenness can be obtained.

The light-emitting device of the present invention can obtain a required fluorescence intensity with a smaller thickness than ever before, because in the light-converting ceramic composite used, the interface of oxide phases being in contact with each other is long and the texture size is small. Accordingly, the light inside of the ceramic composite is small and a larger quantity of light can be radiated from the same light-emitting element. Furthermore, since the ceramic composite is thinner than ever before, the amount of the ceramic composite used can be reduced.

The color tone of the light-emitting device of the present invention can be easily controlled by the thickness of the light-converting ceramic composite.

The light-converting ceramic composite for use in the light-emitting device of the present invention is produced in an appropriate shape such as plate through working such as cutting, machining and polishing. This light-converting ceramic composite can be directly used as a member by itself without requiring a resin for encapsulation, can be used in combination with a high-output violet-to-blue light-emitting element because of no deterioration due to heat or light, and can realize high-output light emission of a light-emitting device.

Examples of the light-emitting element for use in the white light-emitting device of the present invention include a light-emitting diode element and an element that generates laser light. A light-emitting diode element is compact and inexpensive and is preferred.

According to the present invention, the light-emitting device can consist of a light-converting ceramic composite thinner than ever before and a light-emitting element, so that a light-emitting device reduced in the light loss inside of the light-converting ceramic composite, free from deterioration due to heat or light and very suitable for high-output light emission can be provided at a low cost.

EXAMPLES

The present invention is described in greater detail below by referring to specific examples.

Example 1

An $\alpha$-$Al_2O_3$ powder (purity: 99.99%) was weighed 0.82 mol in terms of $AlO_{3/2}$, a $Y_2O_3$ powder (purity: 99.9%) was weighed 0.175 mol in terms of $YO_{3/2}$, and a $CeO_2$ powder (purity: 99.9%) was weighed 0.005 mol. These powders were we mixed in ethanol by a ball mill for 16 hours and then, the ethanol was removed using an evaporator to obtain a raw material powder. This raw material powder was subjected to preliminary melting in a vacuum furnace and used as a raw material for unidirectional solidification.

The raw material was directly charged into a molybdenum crucible and after setting the crucible in a unidirectional solidification apparatus, the raw material was melt-fused under a pressure of $1.33 \times 10^{-3}$ Pa ($10^{-5}$ Torr). In the same atmosphere, the crucible was moved down at a speed of 40 mm/hour to obtain a solidified body comprising three oxide phases, that is, $Al_2O_3$ (sapphire) phase, $(Y,Ce)_3Al_5O_{12}$ phase and $CeAl_{11}O_{18}$ phase.

Figure 3:
FIG. 3 is a photomicrograph of Example 1 illustrating one example of the texture structure of the light-converting ceramic composite of the present invention.

FIG. 3 illustrates a cross-sectional texture perpendicular to the solidification direction of the solidified body. The black portion A is the $Al_2O_3$ (sapphire) phase, the white portion B is the $(Y,Ce)_3Al_5O_{12}$ phase, and the gray portion C, that is slightly present, is the $CeAl_{11}O_{18}$ phase. It is seen that the solidified body has a texture of respective oxide phases being continuously and three-dimensionally entangled with each other. The texture consists of a microsize portion and a slightly large portion surrounding the microsize portion, and macroscopically, it is seen that the $(Y,Ce)_3Al_5O_{12}$ phase is uniformly distributed. By virtue of this uniform distribution, homogeneous fluorescence can be obtained. The texture size has a distribution and the interface length differs between the microsize portion and the large portion, but on average as a whole, the interface length was 220 mm/mm$^2$. In this way, even when the texture size has a distribution, as long as the texture is a microtexture where the average interface length is macroscopically 150 mm/mm$^2$ or more, the effects can be obtained.

Figure 4:
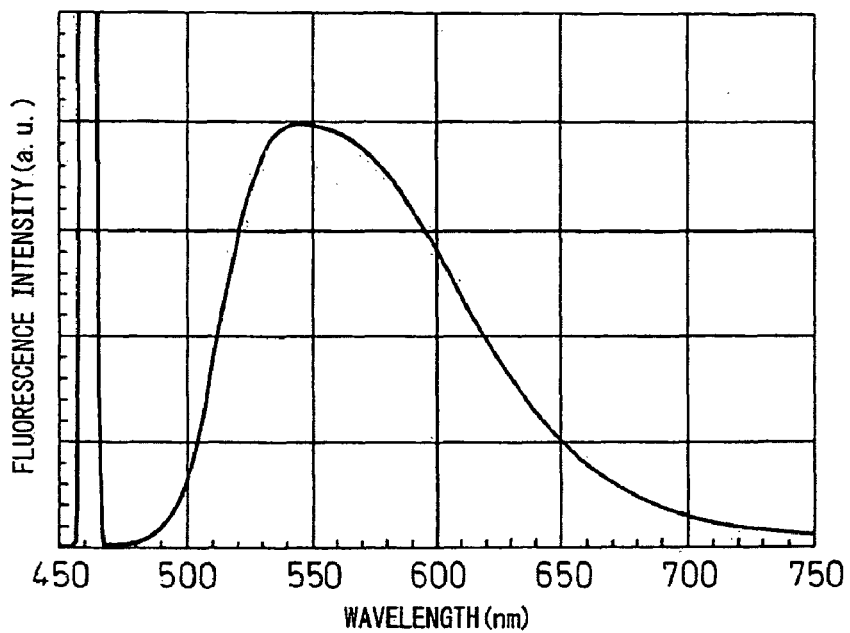
FIG. 4 is a fluorescence spectrum of Example 1 illustrating one example of the fluorescence characteristics of the light-converting ceramic composite of the present invention.

A disc-like sample of φ16 mm×0.2 mm was cut out from the solidified body and evaluated for the fluorescence characteristics by a solid quantum efficiency measuring apparatus manufactured by JASCO Corp. In order to determine the true spectrum, correction was performed using a secondary standard light source. FIG. 4 illustrates the fluorescence spectrum. With excitation light at a wavelength of 460 nm, a broad fluorescence spectrum having a peak wavelength at 547 nm was obtained.

A light-converting ceramic composite in a plate form of 2 mm×2 mm×0.15 mm with the plane of 2 mm×2 mm being a mirror surface was produced from the solidified body obtained, and by making excitation light at a wavelength of 463 nm to be incident thereon, fluorescence at a wavelength of 547 nm radiated on the opposite side was collected using an integrating sphere to measure the fluorescence intensity. Assuming that the maximum fluorescence intensity of Comparative Example 1 described later having an interface length of 50 mm/mm$^2$ with the same thickness is 100, the relative fluorescence intensity of this Example becomes 119, revealing that when the interface length is 150 mm/mm$^2$ or more, fluorescence higher in the intensity by 10% or more is obtained.

Comparative Example 1

A solidified body was produced in the same manner as in Example 1 except for moving down the crucible at a speed of 5 mm/hour. The interface length of the solidified body obtained was 50 mm/mm$^2$. A light-converting ceramic composite in a plate form of 2 mm×2 mm×0.15 mm with tho piano of 2 mm×2 mm being a mirror surface was produced from the solidified body obtained, and the fluorescence intensity was measured in the same manner as in Example 1. Assuming that the obtained maximum fluorescence intensity is 100, the fluorescence intensity in the following Examples is shown by a relative value thereto. As described above, only fluorescence lower the intensity by 10% or more than Example 1 was obtained.

Examples 2 to 5

Solidified bodies differing in the interface length were produced in the same manner as in Example 1 except for moving down the crucible at a speed of 30 to 250 mm/hour. The crucible dropping speed in each Example and the interface length determined by averaging the obtained texture size distribution are shown in Table 1. A light-converting ceramic composite in a plate form of 2 mm×2 mm×0.15 mm with the plane of 2 mm×2 mm being a mirror surface was produced from each solidified body, and the fluorescence intensity was measured in the same manner as in Example 1. The results obtained are shown together in Table 1. When the interface length on average is 150 mm/mm$^2$ or more, fluorescence higher in intensity by 10% or more than in Comparative Example 1 is obtained and as the interface length becomes longer, the relative fluorescence intensity more increases.

Example 6

From a solidified body with an interface length of 220 mm/mm$^2$ produced in the same manner as in Example 1, a light-converting ceramic composite in a plate form of 2 mm×2 mm×0.10 mm with the plane of 2 mm×2 mm being a mirror surface was produced. The fluorescence intensity was measured in the same manner as in Example 1, as a result, a relative fluorescence intensity of 106 was obtained. It is seen that with a thickness as small as ⅔ of Comparative Example 1, an equivalent or higher fluorescence intensity is obtained.

TABLE 1

| | Crucible Dropping Speed mm/hr | Interface Length (mm/mm$^2$) | Thickness (mm) | Relative Fluorescence Intensity |
|---|---|---|---|---|
| Example 1 | 40 | 220 | 0.15 | 119 |
| Example 2 | 30 | 170 | 0.15 | 115 |
| Example 3 | 85 | 500 | 0.15 | 125 |
| Example 4 | 170 | 1000 | 0.15 | 129 |
| Example 5 | 250 | 1500 | 0.15 | 131 |
| Example 6 | 40 | 220 | 0.1 | 106 |
| Comparative Example 1 | 5 | 50 | 0.15 | 100 |

Comparative Example 2

Figure 5:
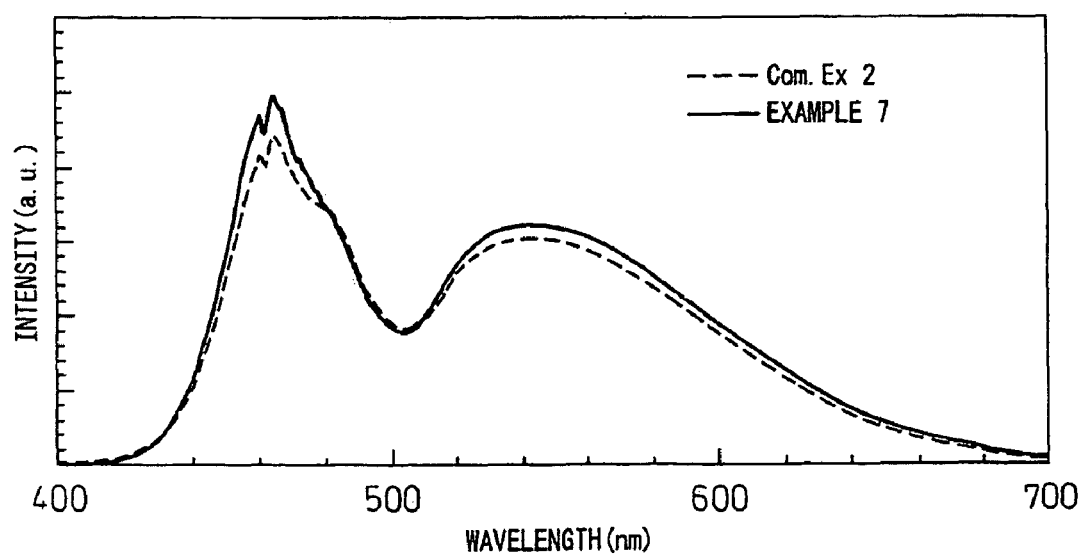
FIG. 5 is a light emission spectrum of Example 7 illustrating one example of the light emission spectrum of the light-emitting device of the present invention.

The plate-like light-converting ceramic composite of 2 mm×2 mm×0.15 mm having an interface length of 50 mm/mm$^2$ obtained in Comparative Example 1 was combined with a blue (463 nm) light-emitting diode element to fabricate a white light-emitting device illustrated in FIG. 2. FIG. 5 illustrates the light emission spectrum of the obtained white light-emitting device. It is recognized that a light component having a peak at blue (463 nm) and a light component having a peak at yellow (near 540 nm) from the light-converting ceramic composite were mixed. The CIE color coordinates were x=0.27 and y=0.30.

Example 7

The plate-like light-converting ceramic composite of 2 mm×2 mm×0.10 mm having an interface: length of 220 mm/mm² obtained in Example 6 was combined with a blue (463 nm) light-emitting diode element to fabricate a white light-emitting device similar to that in Comparative Example 2. FIG. 5 illustrates the light emission spectrum of the obtained white light-emitting device together with that of Comparative Example 2. The CIE color coordinates were x=0.27 and y=0.29, and almost the same chromaticity as in Comparative Example 2 was obtained. When the integrated value of total light (total radiation flux) in the spectrum is compared, assuming that the value of Comparative Example 2 is 1, that of Example 7 becomes 1.06. Thus, a larger quantity of light (radiation flux) is obtained in Example 7. This reveals that by prolonging the interface length, a light-emitting device having the same chromaticity can be fabricated from a light-converting ceramic composite with a smaller thickness and a high-efficiency light-emitting device reduced in the light loss inside of the light-converting ceramic composite can be provided at a low cost.

INDUSTRIAL APPLICABILITY

The light-converting ceramic composite of the present invention and the light-emitting device using the light-converting ceramic composite can be used, for example, in a light-emitting diode applicable to displays, lighting, backlight sources and the like, and the industrial applicability thereof is apparent.

The invention claimed is:

1. A light-converting ceramic composite, which is a bulk comprising a solidified body having a texture of at least two or more oxide phases being continuously and three-dimensionally entangled together, with at least one of said oxide phases being a fluorescence-emitting crystal phase, wherein the interface length between said oxide phases per 1 mm² of a plane in said light-converting ceramic composite is from 150 to 1,500 mm.

2. The light-converting ceramic composite as claimed in claim 1, wherein said interface length is from 200 to 1,500 mm/mm².

3. The light-converting ceramic composite as claimed in claim 2, which contains at least the Y element, the Al element and the Ce element as the composition components.

4. A light-emitting device comprising the light-converting ceramic composite claimed in claim 3 and a light-emitting element.

5. The light-emitting device as claimed in claim 4, wherein said light-converting ceramic composite emits fluorescence having a peak at a wavelength of 530 to 580 nm and said light-emitting element emits light having a peak at a wavelength of 400 to 500 nm.

6. A light-emitting device comprising the light-converting ceramic composite claimed in claim 2 and a light-emitting element.

7. The light-emitting device as claimed in claim 6, wherein said light-converting ceramic composite emits fluorescence having a peak at a wavelength of 530 to 580 nm and said light-emitting element emits light having a peak at a wavelength of 400 to 500 nm.

8. The light-converting ceramic composite as claimed in claim 1, which contains at least the Y element, the Al element and the Ce element as the composition components.

9. A light-emitting device comprising the light-converting ceramic composite claimed in claim 8 and a light-emitting element.

10. The light-emitting device as claimed in claim 9, wherein said light-converting ceramic composite emits fluorescence having a peak at a wavelength of 530 to 580 nm and said light-emitting element emits light having a peak at a wavelength of 400 to 500 nm.

11. A light-emitting device comprising the light-converting ceramic composite claimed in claim 1 and a light-emitting element.

12. The light-emitting device as claimed in claim 11, wherein said light-converting ceramic composite emits fluorescence having a peak at a wavelength of 530 to 580 nm and said light-emitting element emits light having a peak at a wavelength of 400 to 500 nm.

* * * * *